United States Patent
Managaki et al.

(10) Patent No.: US 9,576,925 B2
(45) Date of Patent: Feb. 21, 2017

(54) SEMICONDUCTOR DEVICE HAVING A CYLINDRICAL SHAPED CONDUCTIVE PORTION

(71) Applicant: Kabushiki Kaisha Toshiba, Minato-ku (JP)

(72) Inventors: Nobuto Managaki, Kawasaki (JP); Hiroshi Yamada, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/870,377

(22) Filed: Sep. 30, 2015

(65) Prior Publication Data
US 2016/0218076 A1   Jul. 28, 2016

(30) Foreign Application Priority Data

Jan. 26, 2015 (JP) .................................. 2015-012259

(51) Int. Cl.
*H01L 23/52* (2006.01)
*H01L 23/00* (2006.01)
(Continued)

(52) U.S. Cl.
CPC ............. *H01L 24/13* (2013.01); *H01L 21/486* (2013.01); *H01L 21/4857* (2013.01);
(Continued)

(58) Field of Classification Search
CPC ...... H01L 24/13; H01L 24/11; H01L 23/5226; H01L 23/5383; H01L 23/5386; H01L 23/5389
See application file for complete search history.

(56) References Cited

U.S. PATENT DOCUMENTS 7,176,506 B2 * 2/2007 Beroz ................. H01F 17/0033
                                                       257/232
7,718,901 B2 * 5/2010 Takahashi ............. H05K 1/183
                                                       174/254
(Continued)

FOREIGN PATENT DOCUMENTS

JP         2005-303258         10/2005
JP         2006-253631          9/2006
(Continued)

OTHER PUBLICATIONS

Soon Wee Ho et al. "Via-in-Mold (ViM) Process for Embedded Wafer Level Package (eWLP)", Electronics Packaging Technology Conference (EPTC 2013), 2013 IEEE 15th. IEEE, 2013, 6 pages.

*Primary Examiner* — Ida M Soward
(74) *Attorney, Agent, or Firm* — Oblon, McClelland, Maier & Neustadt, L.L.P.

(57) ABSTRACT

A semiconductor device includes a first conductive portion, a second conductive portion, a first layer, and a second layer. The first conductive portion includes a first end portion and a first extending portion. The first extending portion extends in a first direction. The length of the first extending portion in a second direction is shorter than a length of at least a part of the first end portion in the second direction. The first layer includes multiple semiconductor chips, multiple passive chip components, and a resin. The first extending portion includes a first portion and a second portion. The first layer is provided around the first portion. The first layer expands along a first plane. The first plane intersects the first direction. The second layer includes a first multilayer wiring. The second layer expands along a second plane intersecting the first direction.

10 Claims, 8 Drawing Sheets

(51) Int. Cl.
*H01L 23/538* (2006.01)
*H01L 21/48* (2006.01)
*H01L 25/10* (2006.01)
*H01L 23/522* (2006.01)
*H01L 23/498* (2006.01)

(52) U.S. Cl.
CPC ...... *H01L 23/5383* (2013.01); *H01L 23/5384* (2013.01); *H01L 23/5389* (2013.01); *H01L 24/11* (2013.01); *H01L 25/105* (2013.01); *H01L 23/49816* (2013.01); *H01L 23/5226* (2013.01); *H01L 23/5386* (2013.01); *H01L 2224/1146* (2013.01); *H01L 2224/1183* (2013.01); *H01L 2224/11823* (2013.01); *H01L 2224/11848* (2013.01); *H01L 2224/13009* (2013.01); *H01L 2224/13011* (2013.01); *H01L 2224/13025* (2013.01); *H01L 2224/1357* (2013.01); *H01L 2224/13553* (2013.01); *H01L 2224/13564* (2013.01)

(56) References Cited

U.S. PATENT DOCUMENTS

| | | | |
|---|---|---|---|
| 7,741,148 B1 * | 6/2010 | Marimuthu | H01L 23/3121 257/E21.508 |
| 8,133,762 B2 * | 3/2012 | Pagaila | H01L 21/568 257/741 |
| 8,159,047 B2 * | 4/2012 | Huang | H01L 23/50 257/532 |
| 8,759,953 B2 * | 6/2014 | Yamamoto | H01L 23/3121 257/659 |
| 2005/0205997 A1 | 9/2005 | Yamamoto et al. | |
| 2006/0220230 A1 | 10/2006 | Tanaka et al. | |
| 2008/0024998 A1 * | 1/2008 | Hsu | H01L 23/5389 361/719 |
| 2008/0099888 A1 | 5/2008 | Kurihara et al. | |
| 2009/0140415 A1 * | 6/2009 | Furuta | H01L 23/49833 257/700 |
| 2010/0133704 A1 * | 6/2010 | Marimuthu | H01L 21/565 257/778 |
| 2010/0244059 A1 | 9/2010 | Iida et al. | |
| 2010/0285256 A1 | 11/2010 | Boukobza | |
| 2011/0215478 A1 | 9/2011 | Yamamichi et al. | |
| 2012/0175732 A1 * | 7/2012 | Lin | H01L 23/49816 257/531 |
| 2013/0277851 A1 * | 10/2013 | Lin | H01L 21/76802 257/773 |
| 2013/0307113 A1 * | 11/2013 | Kunimoto | H01L 23/49827 257/528 |
| 2014/0084473 A1 | 3/2014 | Moon et al. | |
| 2014/0311771 A1 * | 10/2014 | Shimizu | H01L 23/5383 174/251 |

FOREIGN PATENT DOCUMENTS

| | | |
|---|---|---|
| JP | 2006-286677 | 10/2006 |
| JP | 2009-239147 | 10/2009 |
| JP | 2010-67623 | 3/2010 |
| JP | 2010-232577 | 10/2010 |
| JP | 2011-509202 | 3/2011 |
| JP | 2011-187473 | 9/2011 |
| JP | 2013-58545 | 3/2013 |
| JP | 2014-68014 | 4/2014 |

* cited by examiner

SEMICONDUCTOR DEVICE HAVING A CYLINDRICAL SHAPED CONDUCTIVE PORTION

CROSS-REFERENCE TO RELATED APPLICATIONS

This application is based upon and claims the benefit of priority from Japanese Patent Application No. 2015-012259, filed on Jan. 26, 2015; the entire contents of which are incorporated herein by reference.

FIELD

Embodiments described herein relate generally to a semiconductor device and a method for manufacturing the same.

BACKGROUND

There has been known a technique called pseudo SoC (System on Chip), in which multiple semiconductor chips, each of which is manufactured through a different process, are disposed and reconstructed as a semiconductor device. High reliability is demanded for a semiconductor device using this pseudo SoC and a method for manufacturing the device.

DETAILED DESCRIPTION

Figure 1:
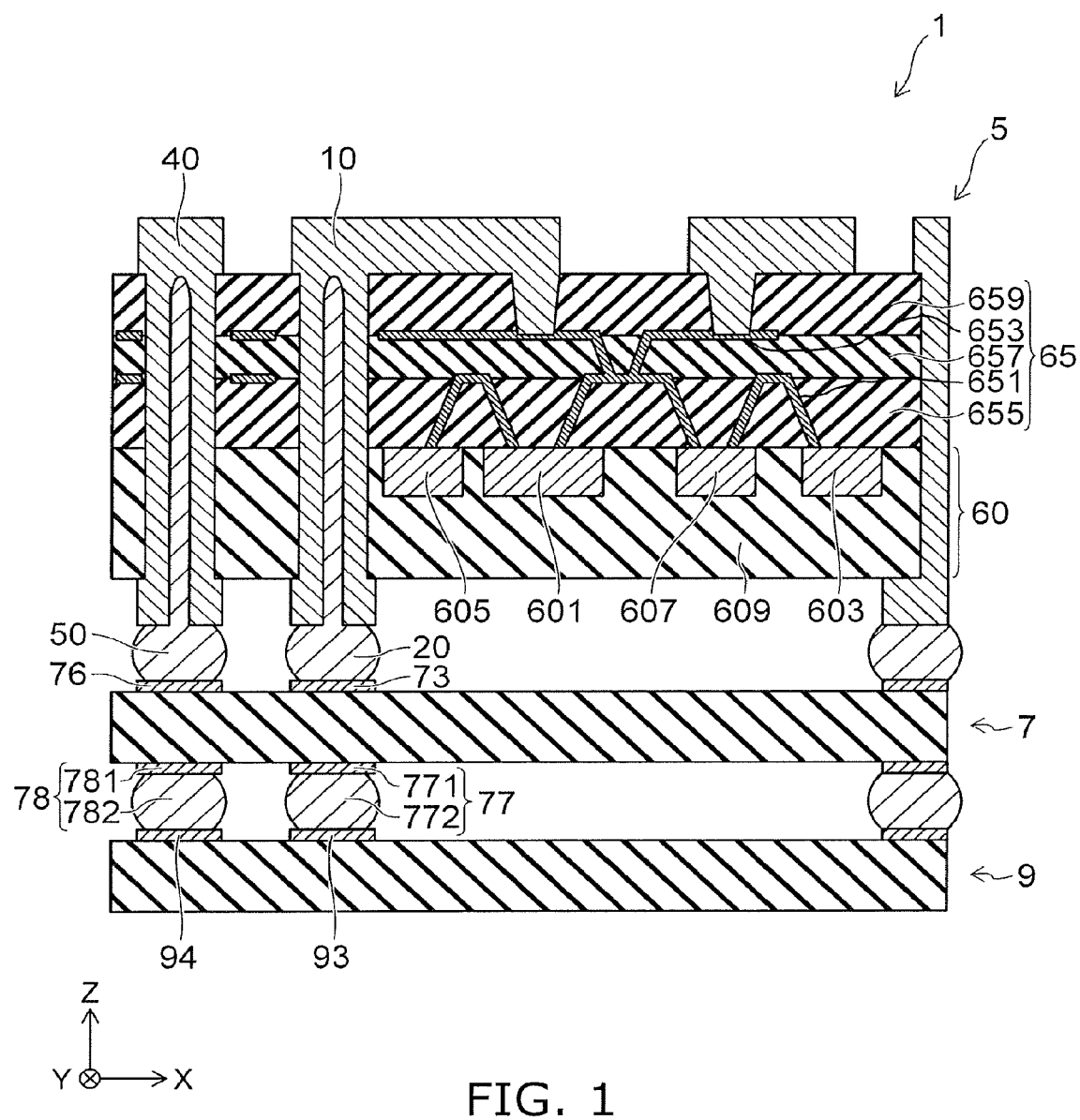
FIG. 1 is a cross-sectional view of a semiconductor device according to a first embodiment.

A semiconductor device includes a first conductive portion, a second conductive portion, a first layer, and a second layer. The first conductive portion includes a first end portion and a first extending portion. The first extending portion is in the form of a cylinder. The first end portion contains a first conductive material. The first extending portion extends in a first direction. The first extending portion contains the first conductive material. The first extending portion is connected to the first end portion. The length of the first extending portion in a second direction is shorter than a length of at least a part of the first end portion in the second direction. The second direction intersects the first direction. The first extending portion includes a first portion and a second portion. The second portion is arranged with the first portion in the first direction. The second conductive portion includes a second end portion. The second end portion is separated from the first end portion in the first direction. The second end portion is electrically connected to the first extending portion. The first extending portion is provided between the first end portion and the second end portion. The first layer includes multiple semiconductor chips, multiple passive chip components, and a resin. The first layer is provided around the first portion. The first layer expands along a first plane. The first plane intersects the first direction. One of the multiple semiconductor chips has at least any of a function different from a function of another one of the multiple semiconductor chips, a shape different from a shape of the another semiconductor chip, and a size different from a size of the another semiconductor chip. The resin is in contact with the multiple semiconductor chips and the multiple passive chip components. The second layer is provided around the second portion. The second layer includes a first multilayer wiring. The first multilayer wiring is electrically connected to at least one of the multiple semiconductor chips, at least one of the multiple passive chip components, and the first conductive portion. The second layer expands along a second plane intersecting the first direction.

Hereinafter, respective embodiments of the invention will be described with reference to the drawings.

Incidentally, the drawings are schematic or conceptual, and the relationship between the thickness and the width of each portion, the ratio of the sizes between portions, and the like are not necessarily identical to actual ones. Further, the same portion may sometimes be shown with different dimensions or ratios depending on the drawings.

In the present specification and the respective drawings, components similar to those described previously with reference to earlier drawings are labeled with like reference numerals, and a detailed description thereof is omitted appropriately.

FIG. 1 is a cross-sectional view of a semiconductor device according to a first embodiment.

Figure 2:
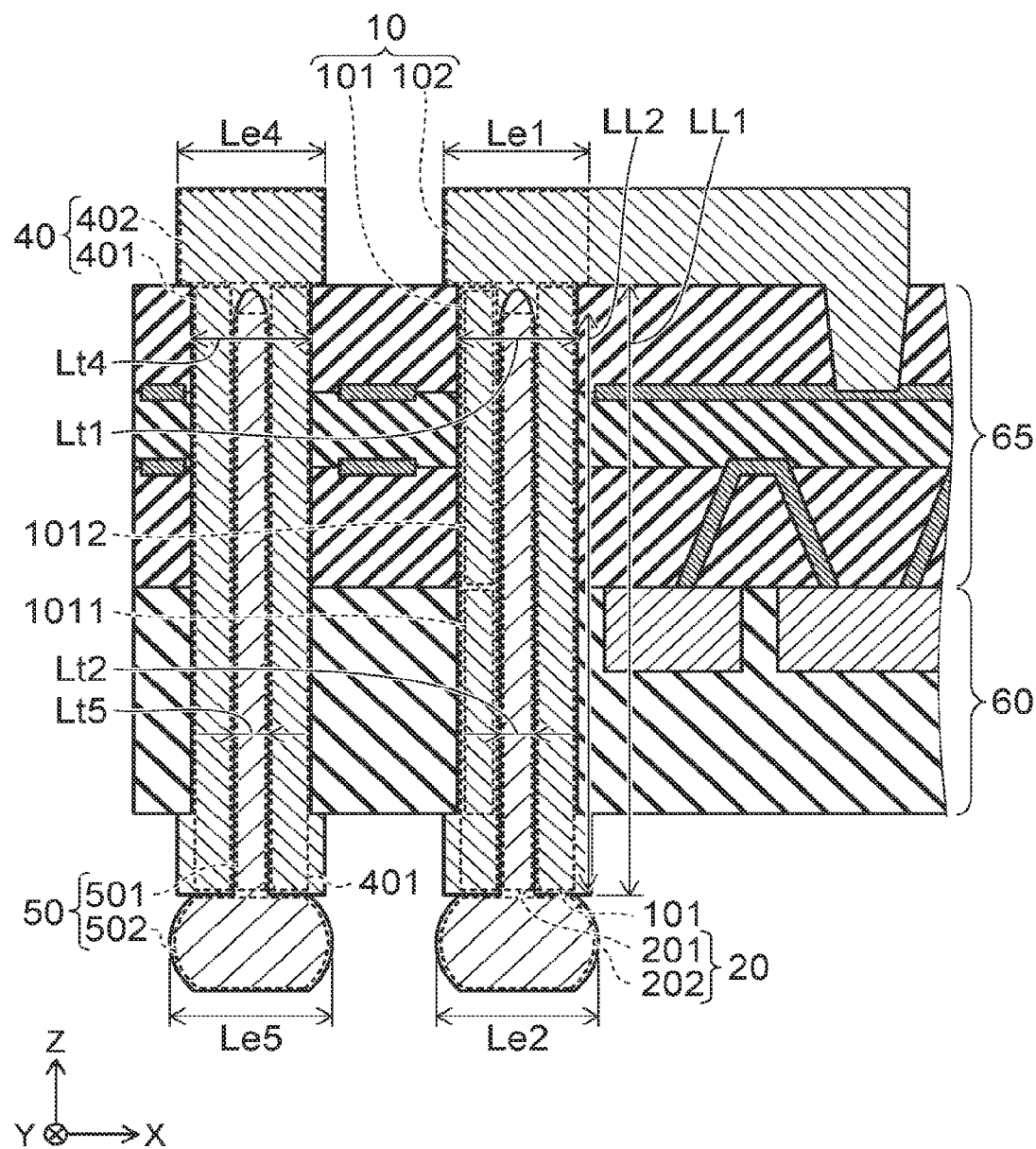
FIG. 2 is a partially enlarged cross-sectional view of the semiconductor device according to the first embodiment.

FIG. 2 is a partially enlarged cross-sectional view of the semiconductor device according to the first embodiment.

As shown in FIG. 1, a semiconductor device 1 includes a semiconductor module 5. In this example, the semiconductor device 1 further includes a semiconductor module 7 and a printed wiring board 9. The semiconductor module 7 and the printed wiring board 9 will be described later.

The semiconductor module 5 includes a first conductive portion 10, a second conductive portion 20, a fourth conductive portion 40, and a fifth conductive portion 50, a first layer 60, and a second layer 65.

As shown in FIG. 2, the first conductive portion 10 includes a first extending portion 101 and a first end portion 102.

The first extending portion 101 extends in a first direction. One end in a first direction of the first extending portion 101 is connected to the first end portion 102. The first extending portion 101 contains a first conductive material.

The first extending portion 101 is in the form of a cylinder. The inside of the first extending portion may be a void. A part of the second conductive portion 20, which will be described later, may be provided in the inside of the first extending portion 101.

The first direction is, for example, a Z-direction shown in FIG. 1.

The first end portion 102 contains the first conductive material in the same manner as the first extending portion 101. At least a part of the first end portion 102 does not overlap with the second layer 65 in a second direction intersecting the first direction.

In the embodiment, the second direction is a direction perpendicular to the first direction. The second direction is, for example, an X-direction shown in FIG. 1.

The first extending portion 101 includes a first portion 1011 and a second portion 1012.

The first portion 1011 is arranged with the first layer 60 in the second direction.

The second portion 1012 is arranged with the second layer 65 in the second direction. The second portion 1012 is arranged with the first portion 1011 in the first direction. The second portion 1012 is provided between the first portion 1011 and the first end portion 102.

A length Le1 (width) of at least a part of the first end portion 102 in the second direction is longer (wider) than a length Lt1 (width) of the first extending portion 101 in the second direction. Specifically, the length (length Le1) of a portion of the first end portion 102 in the second direction, which does not overlap with the second layer 65 in the second direction is longer than the length Lt1 of the first extending portion 101 in the second direction. That is, the length Lt1 of the first extending portion 101 in the second direction is shorter than the length (length Le1) of at least a part of the first end portion 102 in the second direction.

The first end portion 102 is desirably formed continuously with the first extending portion 101. For example, the first end portion 102 is continuous with the first extending portion 101. It is desirable that there is no boundary between the first end portion 102 and the first extending portion 101. The first end portion 102 and the first extending portion 101 are, for example, seamless.

As the first conductive material, for example, a metal is used. Specific examples of the first conductive material will be described later.

The second conductive portion 20 includes a second extending portion 201 and a second end portion 202. The second extending portion 201 extends in the first direction. The second extending portion 201 contains a second conductive material.

One end of the second extending portion 201 in the first direction is connected to the second end portion 202.

The other end of the second extending portion 201 in the first direction is connected to, for example, the first end portion 102. A void may exist between the second extending portion 201 and the first end portion 102.

The second extending portion 201 is provided in the inside of the cylinder of the first extending portion 101 in the form of a cylinder.

The first portion 1011 of the first extending portion 101 is provided between a part of the second extending portion 201 and the first layer 60. The second portion 1012 of the first extending portion 101 is provided between another part of the second extending portion 201 and the second layer 65.

A part of the second extending portion 201 is surrounded by the second layer 65. The second layer 65 is provided around the second extending portion 201. Another part of the second extending portion 201 is surrounded by the first layer 60. The first layer 60 is provided around another part of the second extending portion 201.

The second extending portion 201 may not be provided in a region surrounded by the second layer 65.

The second end portion 202 is separated from the first end portion 102 in the first direction.

The first extending portion 101 and the second extending portion 201 are provided between the first end portion 102 and the second end portion 202.

The second end portion 202 contains the second conductive material in the same manner as the second extending portion 201.

The second end portion 202 is electrically connected to the second extending portion 201. The second end portion 202 is electrically connected to a third conductive portion 73 of the semiconductor module 7 which will be described later.

A length Le2 (width) of at least a part of the second end portion 202 in the second direction is longer (wider) than a length Lt2 (width) of the second extending portion 201 in the second direction. For example, the second end portion 202 has a portion which does not overlap with the first layer 60 in the second direction. The length (length Le2) of the portion in the second direction is longer than the length Lt2 of the second extending portion 201 in the second direction. That is, the length Lt2 of the second extending portion 201 in the second direction is shorter than the length (length Le2) of at least a part of the second end portion 202 in the second direction.

The length Lt1 of the first extending portion 101 in the second direction is longer than the length Lt2 of the second extending portion 201 in the second direction.

The second end portion 202 is desirably formed continuously with the second extending portion 201. For example, the second end portion 202 is continuous with the second extending portion 201. It is desirable that there is no boundary between the second end portion 202 and the second extending portion 201. For example, the second end portion 202 and the second extending portion 201 are seamless.

As the second conductive material, a metal is used. Specific examples of the second conductive material will be described later.

The first conductive material is, for example, different from the second conductive material. The first conductive material has, for example, a melting point higher than a melting point of the second conductive material.

The first layer 60 is, for example, a layer formed by using a pseudo SoC technique. In the pseudo SoC technique, multiple semiconductor chips and multiple passive chip components are reconstructed as one chip by fixing with a resin.

The first layer 60 expands along a first plane intersecting the first direction. The first layer 60 is provided around the first portion 1011 of the first extending portion 101.

The first plane is, for example, a plane parallel to the X-direction and a Y-direction perpendicular to the X-direction and the Z-direction in FIG. 1.

The first layer 60 includes multiple semiconductor chips 601 and 603.

The semiconductor chips 601 and 603 are arranged with each other along the first plane.

As the semiconductor chips 601 and 603, semiconductor chips having various configurations and functions (for example, LSI (Large Scale Integration), MEMS (Micro Electro Mechanical Systems), and the like) are adopted. The semiconductor chip 601 is different from the semiconductor chip 603 in at least any one of the function, shape, and size. That is, the semiconductor chip 601 has at least any one of a function different from that of the semiconductor chip 603, a shape different from that of the semiconductor chip 603, and a size different from that of the semiconductor chip 603.

As one example, the semiconductor chip 601 has a function such as signal amplification, signal calculation, signal transmission, signal reception, or storage of information, and the semiconductor chip 603 has a function different from that of the semiconductor chip 601 among these functions.

The first layer 60 further includes multiple passive chip components 605 and 607.

The passive chip components 605 and 607 are arranged with each other along the first plane. At least one of the passive chip components 605 and 607 is electrically connected to at least one of the semiconductor chips 601 and 603.

The passive chip components 605 and 607 are each a component formed into a chip having, for example, a function as a passive element such as a resistance, a capacitor, or a coil. The function of the passive chip component 605 may be different from that of the passive chip component 607.

In the following description, when the semiconductor chips 601 and 603 are not particularly distinguished from each other, these are simply referred to as "semiconductor chips". In the same manner, when the passive chip components 605 and 607 are not particularly distinguished from each other, these are simply referred to as "passive chip components".

The number of the semiconductor chips and the number of the passive chip components shown in FIG. 1 are merely examples, and the semiconductor module 5 may include more semiconductor chips and passive chip components.

The first layer 60 further includes a resin 609. The resin 609 is in contact with the multiple semiconductor chips and the multiple passive chip components. The resin 609 is provided around the first portion 1011 of the first extending portion 101.

As the resin 609, for example, an epoxy resin or the like is used. Examples of another material which can be used as the resin 609 will be described later.

The resin 609 may contain, for example, a filler. By the filler, for example, an insulating property is improved. By the filler, for example, a dielectric property is improved. As the filler, for example, silicon oxide or the like is used. Examples of another material which can be used as the filler will be described later.

The second layer 65 is arranged with the first layer 60 in the first direction. That is, in the first direction, at least a part of the second layer 65 overlaps with at least a part of the first layer 60.

The second layer 65 expands along a second plane intersecting the first direction. The second plane is, for example, a plane parallel to the X-direction and the Y-direction.

The second layer 65 is provided around the second portion 1012 of the first extending portion 101.

The second layer 65 includes a first wiring layer 651, which is a first multilayer wiring, a second wiring layer 653, which is a first multilayer wiring, a first insulating layer 655, a second insulating layer 657, and a third insulating layer 659.

The second wiring layer 653 is provided separated from the first wiring layer 651 in the first direction.

The first insulating layer 655 is provided between the resin 609 and the first wiring layer 651.

The second insulating layer 657 is provided between the first wiring layer 651 and the second wiring layer 653.

The third insulating layer 659 is provided on the second wiring layer 653. Between a part of the second wiring layer 653 and a part of the first conductive portion 10, a part of the third insulating layer 659 is provided.

A part of a wiring included in the first wiring layer 651 is connected to the semiconductor chip 601 and the passive chip component 605. Another part of the wiring included in the first wiring layer 651 is connected to the semiconductor chip 601 and the passive chip component 607. Still another part of the wiring included in the first wiring layer 651 is connected to the semiconductor chip 603 and the passive chip component 607.

A part of a wiring included in the second wiring layer 653 is connected to the first conductive portion 10.

The first wiring layer 651 is, for example, connected to the second wiring layer 653 through a via.

That is, at least one of the semiconductor chips 601 and 603, at least one of the passive chip components 605 and 607, and the first conductive portion 10 are electrically connected to a first multilayer wiring layer including the first wiring layer 651 and the second wiring layer 653.

As the material of the first wiring layer 651 and the second wiring layer 653, a metal or a conductive organic material can be used. In the case of using a metal, for example, a metal such as gold, platinum, silver, tungsten, copper, or aluminum can be used. As an example, the first wiring layer 651 and the second wiring layer 653 have a stacked structure including a titanium layer and an aluminum layer.

As the material of the first insulating layer 655, the second insulating layer 657, and the third insulating layer 659, for example, an insulating resin such as a polyimide, a phenolic resin, or an acrylic resin can be used. As an example, a thermal expansion coefficient of at least any of an insulating material contained in the first insulating layer 655, an insulating material contained in the second insulating layer 657, and an insulating material contained in the third insulating layer 659 is higher than a thermal expansion coefficient of the resin contained in the resin 609.

The fourth conductive portion 40 includes a fourth extending portion 401 and a fourth end portion 402. The fourth extending portion 401 and the fourth end portion 402 contain a third conductive material.

As the third conductive material, the same material as that of the first conductive material can be used. The third conductive material is, for example, the same as the first conductive material.

The fourth extending portion 401 extends in the first direction. One end of the fourth extending portion 401 in the first direction is connected to the fourth end portion 402. A length Le4 of at least a part of the fourth end portion 402 in the second direction is longer than a length Lt4 of the fourth extending portion 401 in the second direction.

The fifth conductive portion 50 includes a fifth extending portion 501 and a fifth end portion 502. The fifth extending portion 501 and the fifth end portion 502 contain a fourth conductive material.

As the fourth conductive material, the same material as that of the second conductive material can be used. The fourth conductive material is, for example, the same as the second conductive material.

A melting point of the third conductive material is, for example, higher than a melting point of the fourth conductive material.

The fifth extending portion 501 extends in the first direction. One end of the fifth extending portion 501 in the first direction is connected to the fifth end portion 502. The other end of the fifth extending portion 501 in the first direction is connected to, for example, the fourth end portion 402. A length Le5 of at least a part of the fifth end portion 502 in the second direction is longer than a length Lt5 of the fifth extending portion 501 in the second direction. The length Lt4 of the fourth extending portion 401 in the second direction is longer than the length Lt5 of the fifth extending portion 501 in the second direction.

A void may exist between the fifth extending portion 501 and the fourth end portion 402.

The fifth extending portion 501 is provided in the inside of the fourth extending portion 401 provided in the form of a cylinder.

In other words, a part of the fourth extending portion 401 is provided between a part of the fifth extending portion 501 and the first layer 60. Another part of the fourth extending portion 401 is provided between another part of the fifth extending portion 501 and the second layer 65.

The fifth end portion 502 is separated from the fourth end portion 402 in the first direction. The fourth extending portion 401 and the fifth extending portion 501 are provided between the fourth end portion 402 and the fifth end portion 502.

According to the semiconductor device according to the above-described embodiment, it becomes possible to reduce a possibility of causing disconnection in the first conductive portion 10.

The reason for this is as follows.

In the case where heat is applied to the semiconductor device 1, stress is applied to a connecting portion between the first extending portion 101 extending in the first direction and the first end portion 102 extending in the second direction. When this stress is large, for example, a crack occurs in the connecting portion between the first extending portion 101 and the first end portion 102, and therefore, disconnection is caused in the first conductive portion 10.

In the semiconductor device according to the embodiment, the first extending portion 101 is provided between the first end portion 102 and the second end portion 202, and the length Lt1 of the first extending portion 101 in the second direction is shorter than the length Le1 of at least a part of the first end portion 102 in the second direction. Due to this, stress to be applied to the connecting portion between the first extending portion 101 and the first end portion 102 can be dispersed in the second direction in the first end portion 102.

Further, since the first extending portion 101 and the first end portion 102 contain the same first conductive material, the adhesiveness between the first extending portion 101 and the first end portion 102 can be improved.

As a result, a possibility of causing disconnection in the connecting portion between the first end portion 102 and the first extending portion 101 is reduced, and thus, the reliability of the semiconductor device 1 can be improved.

In the semiconductor device according to the embodiment, in the case where the thermal expansion coefficient of the resin contained in the resin 609 is different from the thermal expansion coefficient of the insulating material contained in the insulating layers 655, 657, and 659 of the second layer 65, due to a difference between these thermal expansion coefficients, the second layer 65 may sometimes warp. If the second layer 65 warps, stress to be applied to the connecting portion between the first end portion 102 and the first extending portion 101 becomes larger.

Therefore, the configuration of the semiconductor device 1 according to the embodiment is particularly effective in the case where the thermal expansion coefficient of the resin contained in the resin 609 is different from the thermal expansion coefficient of the insulating material contained in the insulating layers 655, 657, and 659 of the second layer 5.

In the semiconductor device according to the embodiment, it is desirable that the second conductive portion 20 includes the second extending portion 201, and the first portion 1011 of the first extending portion 101 is provided between at least a part of the second extending portion 201 and the first layer 60.

By adopting such a configuration, a part of the stress to be applied to the connecting portion between the first extending portion 101 and the first end portion 102 can be dispersed also in the second extending portion 201.

As a result, a possibility of causing disconnection in the connecting portion between the first extending portion 101 and the first end portion 102 can be further reduced.

Further, in the semiconductor device according to the embodiment, it is more desirable that the second extending portion 201 is provided so that the second portion 1012 of the first extending portion 101 is located between a part of the second extending portion 201 and the second layer 65.

By adopting such a configuration, the first extending portion 101 can be brought closer to the connecting portion between the first extending portion 101 and the first end portion 102. Due to this, stress to be applied to the connecting portion between the first end portion 102 and the first extending portion 101 can be dispersed also in the second extending portion 201.

As a result, a possibility of causing disconnection in the connecting portion between the first extending portion 101 and the first end portion 102 can be further reduced.

In the semiconductor device according to the embodiment, since the second conductive portion 20 includes the second extending portion 201, a contact area between the first conductive portion 10 and the second conductive portion 20 can be increased. Due to this, when heat or the like is applied to the semiconductor device 1, stress occurring in the second conductive portion 20 can be reduced.

As a result, a possibility of causing disconnection in the connecting portion between the first conductive portion 10 and the second conductive portion 20 can be reduced, and the reliability of the semiconductor device 1 can be improved.

In the semiconductor device according to the embodiment, it is desirable that the second extending portion 201 and the second end portion 202 contain the same second conductive material. It is because by incorporating the same second conductive material in the second extending portion 201 and the second end portion 202, the adhesiveness between the second extending portion 201 and the second end portion 202 can be improved.

As a result of improvement of the adhesiveness between the second extending portion 201 and the second end portion 202, a possibility of causing disconnection in the connecting portion between the second extending portion 201 and the second end portion 202 can be further reduced.

In the embodiment, the length Lt1 is, for example, 1 micrometer (μm) or more and 1 millimeter (mm) or less. More preferably, the length Lt1 is 10 μm or more and 500 μm or less. The length Le1 is, for example, 1.01 times or more and 2.00 times or less of the length of Lt1.

The length Le2 is, for example, 1 μm or more and 1000 μm or less. More preferably, the length Le2 is 10 μm or more and 200 μm or less.

The length Lt2 is, for example, 100 nanometer (nm) or more and 1000 μm or less. More preferably, the length Lt2 is 1 μm or more and 200 μm or less.

The length Le1-Lt2 is, for example, 1 nm or more and 500 μm or less.

A length LL1 of the first extending portion 101 along the first direction (Z-direction) is, for example, 1 μm or more and 30 mm or less. More preferably, the length LL1 is 10 μm or more and 2 mm or less.

A length LL2 of the second extending portion 201 along the first direction (Z-direction) is, for example, 10% or more and 100% or less of the length LL1. More preferably, the length LL2 is 20% or more and 100% or less of the length LL1.

As the first conductive material, for example, at least any metal of Au, Ag, Cu, Sn, Ni, Pt, Pd, W, and Mo is used. As the first conductive material, for example, a conductive organic material may be used. This conductive organic material includes at least any of polyacetylene, poly(p- phenylene), poly(p-phenylenevinylene), polypyrrole, polythiophene, polyaniline, polyacene, and graphene. The first conductive material may contain at least any of the above-described metals and at least any of the above-described conductive organic materials. The first conductive portion 10 may further contain another metal material. The first conductive portion 10 may contain a resin as long as the conductive portion has conductivity.

As the second conductive material, for example, at least any metal of Au, Ag, Cu, Sn, Ni, Pt, Pd, W, and Mo is used. As the second conductive material, a conductive organic material may be used. This conductive organic material includes at least any of polyacetylene, poly(p-phenylene), poly(p-phenylenevinylene), polypyrrole, polythiophene, polyaniline, polyacene, and graphene. The second conductive material may contain at least any of the above-described metals and at least any of the above-described conductive organic materials. The second conductive portion 20 may further contain another metal material. The second conductive portion 20 may contain a resin as long as the conductive portion has conductivity.

As the resin 609, for example, a phenol resin, a polyester resin, an epoxy resin, a polyimide resin, a fluororesin, or the like is used. The resin 609 may contain any of these resins, and at least either of paper and glass fiber.

Among the above-described materials, particularly, an epoxy resin is preferably used.

As the material of the filler to be contained in the resin 609, for example, inorganic oxide particles are used. The inorganic oxide particles contain, for example, silicon oxide, aluminum oxide, aluminum nitride, boron nitride, zinc oxide, magnesium oxide, zinc oxide, or the like.

As the material of the filler, dielectric particles may be used. The dielectric particles contain, for example, barium titanate, strontium titanate, barium strontium titanate, strontium zirconate, bismuth zirconate, or the like.

Among the above-described materials, particularly, silicon oxide is preferably used.

Hereinafter, an example of a method for manufacturing a semiconductor device according to the first embodiment will be described.

FIGS. 3A to 7B are cross-sectional process views showing processes of manufacturing a semiconductor device according to the first embodiment.

A first layer 60a including multiple semiconductor chips and multiple passive chip components, and a second layer 65a including multiple wiring layers are prepared.

An insulating layer located in the uppermost layer of the second layer 65a is partially etched, and openings OP1 and OP2 are formed. Thus, a wiring is partially exposed.

Figure 3A:
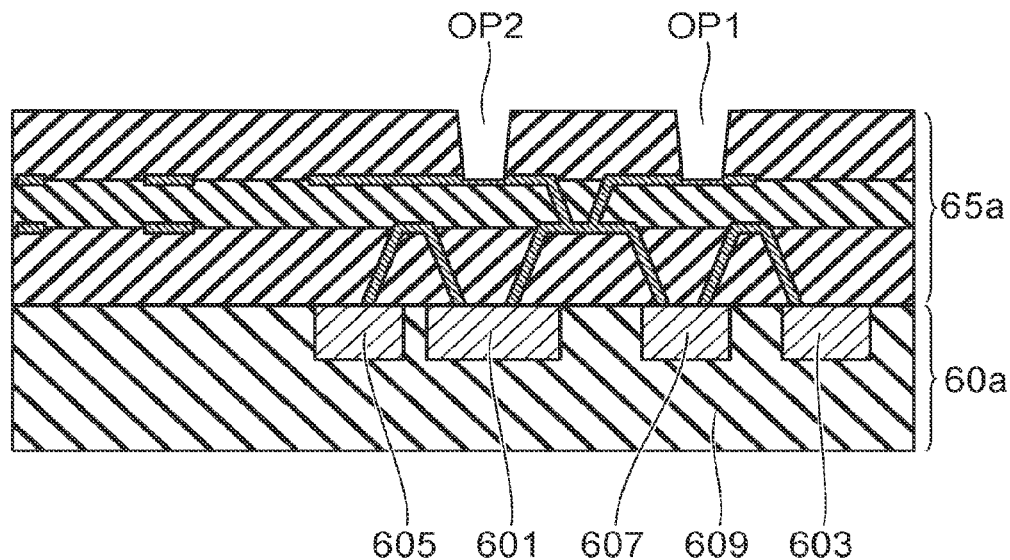
FIGS. 3A to 7B are cross-sectional process views showing processes of manufacturing a semiconductor device according to the first embodiment.

A state at this time is shown in FIG. 3A.

Figure 3B:
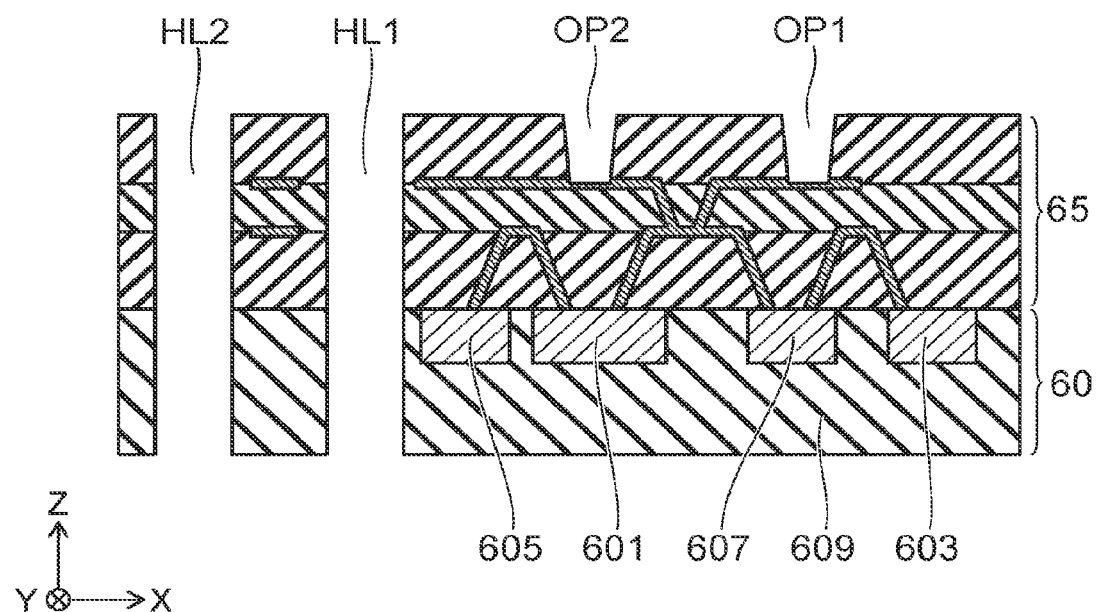

As shown in FIG. 3B, holes HL1 and HL2 passing through a structural body including the first layer 60a and the second layer 65a in the first direction are formed. By this process, a first layer 60 and a second layer 65 having the holes HL1 and HL2 are fabricated.

The shape of each of the holes HL1 and HL2 when seen from the first direction is, for example, a circle. The diameter of each of the holes HL1 and HL2 is, for example, 100 μm. The shape of each of the holes HL1 and HL2 when seen from the first direction may be a polygon or an ellipse.

The holes HL1 and HL2 are formed by, for example, using a mechanical drill or a laser drill.

Figure 4A:
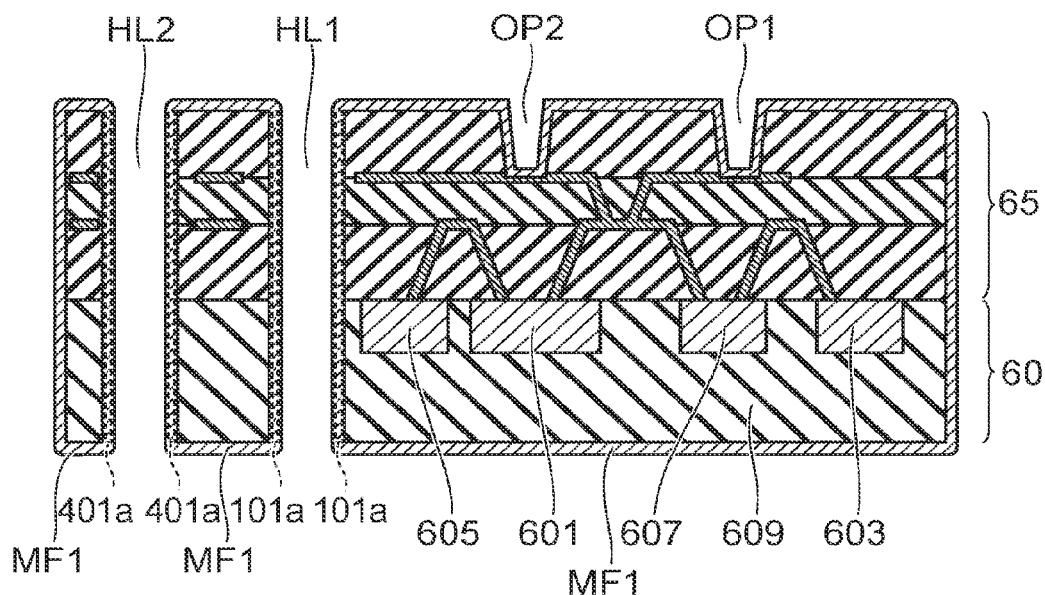

As shown in FIG. 4A, a metal film MF1 is formed on a surface of the structural body including the first layer 60 and the second layer 65. The metal film MF1 is also formed on the inner walls of the openings OP1 and OP2, and on the inner walls of the holes HL1 and HL2. The metal film MF1 is formed by, for example, an electroless plating method using Cu. A film thickness of the metal film MF1 is, for example, 1 μm or less.

By forming the metal film MF1 on the inner walls of the openings OP1 and OP2, the metal film MF1 is electrically connected to a part of the wiring included in the second layer 65.

By this process, in the hole HL1, a first extending portion 101a in the form of a cylinder extending in the first direction is formed. Further, in the hole HL2, a fourth extending portion 401a in the form of a cylinder extending in the first direction is formed.

On the metal film MF1, a photoresist is formed.

Figure 4B:
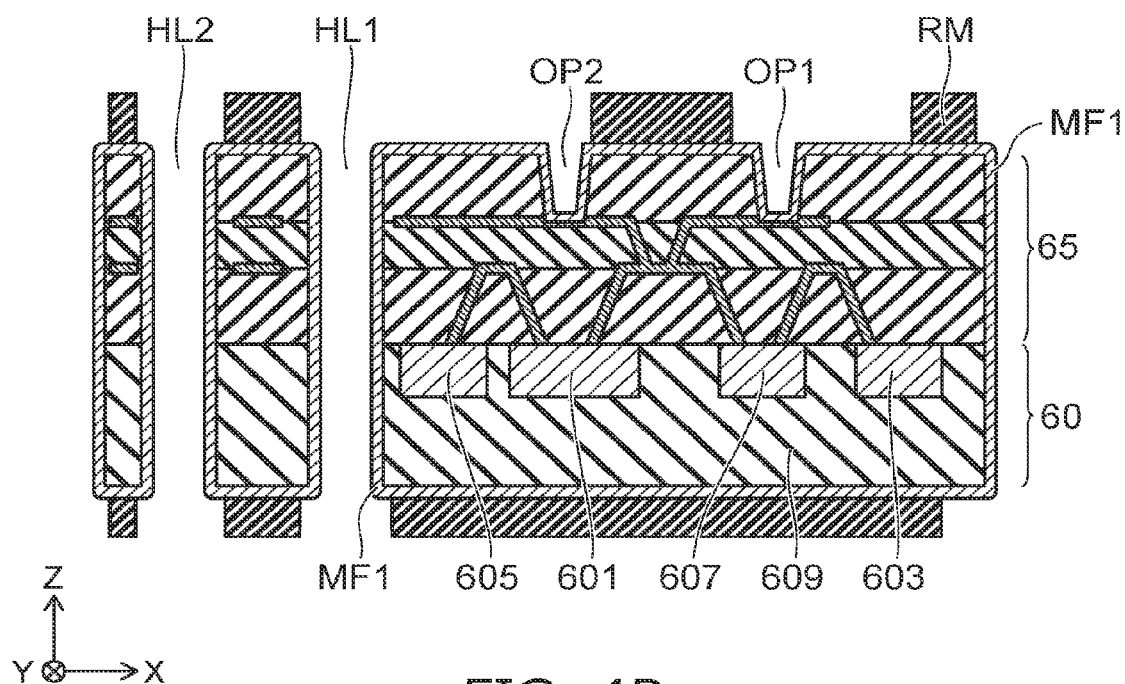

By processing this photoresist, as shown in FIG. 4B, a resist mask RM only partially covering the metal film MF1 is formed. The resist mask RM is partially formed in a region other than the openings OP1 and OP2 and the holes HL1 and HL2.

Figure 5A:
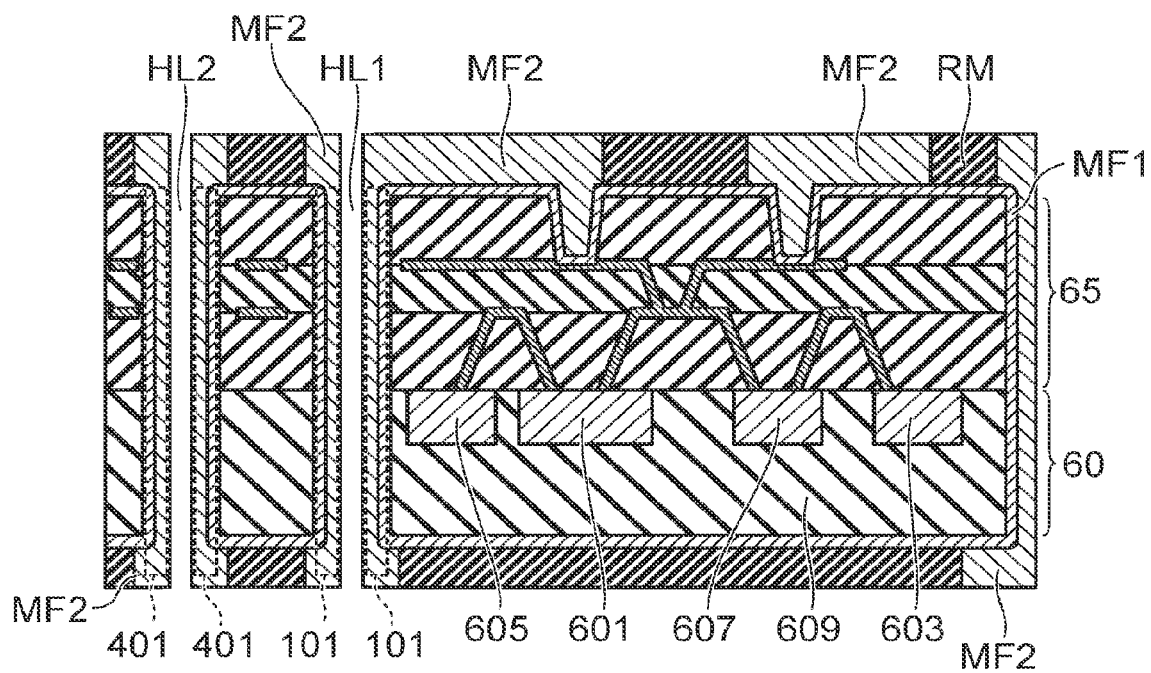

As shown in FIG. 5A, a metal film MF2 is formed on a portion of the metal film MF1 which is not covered with the resist mask RM. At this time, the metal film MF2 is formed also on the inner walls of the holes HL1 and HL2. A film thickness of the metal film MF2 is, for example, 10 μm or more and 20 μm or less.

By this process, for example, the openings OP1 and OP2 are embedded in the metal film MF2.

By this process, in the hole HL1, a first extending portion 101 is formed. A thickness of this first extending portion 101 in a direction perpendicular to the inner wall of the hole HL1 is thicker than a thickness of the first extending portion 101a in a direction perpendicular to the inner wall of the hole HL1.

By this process, in the hole HL2, a fourth extending portion 401 is formed. A thickness of this fourth extending portion 401 in a direction perpendicular to the inner wall of the hole HL2 is thicker than a thickness of the fourth extending portion 401a in a direction perpendicular to the inner wall of the hole HL2.

The metal film MF2 is formed by, for example, an electroplating method using Cu. By forming the metal film MF2 using an electroplating method, for example, a metal material can be efficiently deposited in a portion which is not covered with the resist mask RM.

Figure 5B:
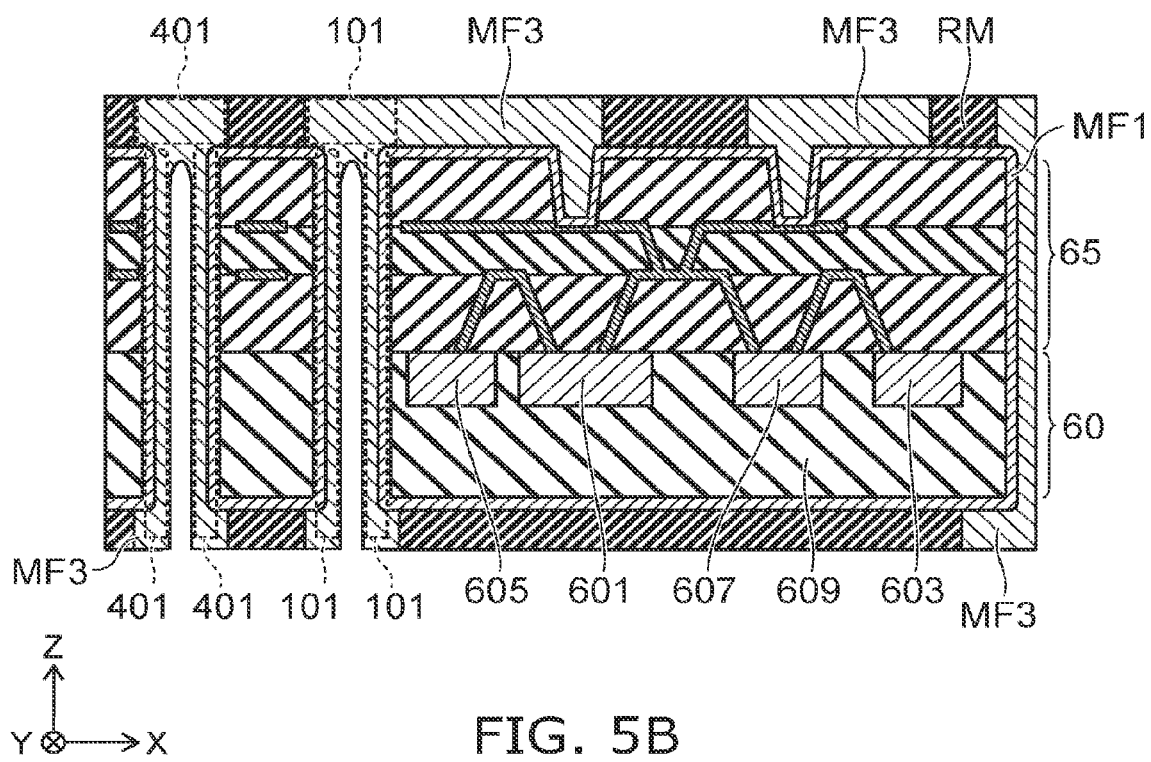

As shown in FIG. 5B, a metal material is deposited on the metal film MF2. By doing this, a metal film MF3 is formed. The metal film MF3 includes the metal film MF2 and a metal material deposited on the metal film MF2. One end of the hole HL1 in the first direction and one end of the hole HL2 in the first direction are closed by the metal film MF3. At this time, each of the inside of the first extending portion 101 and the inside of the fourth extending portion 401 is, for example, a void.

By this process, a first end portion 102 closing one end of the hole HL1 in the first direction and a fourth end portion 402 closing one end of the hole HL2 in the first direction are formed.

The metal film MF3 is formed by, for example, an electroplating method using Cu. In the case where the metal film MF3 is formed by an electroplating method, it is desirable that a voltage to be applied on the second layer 65 side is set higher than a voltage to be applied on the first layer 60 side. By doing this, for example, the both ends of the hole HL1 and the both ends of the hole HL2 can be prevented from being closed by the metal film MF3.

In the case where the metal films MF2 and MF3 are formed by an electroplating method, for example, a current density is set to 0.1 A/dm$^2$ or more and 10 A/dm$^2$ or less.

In the case where the metal films MF2 and MF3 are formed by an electroplating method, by forming the metal films MF2 and MF3 using a pulse current, the flatness of the metal films MF2 and MF3 can be improved.

The metal films MF2 and MF3 may be formed continuously. That is, the metal film MF2 is formed on the entire surface of the metal film MF1 in an electrolytic solution (for example, by applying a voltage uniformly), and successively thereafter, the metal film MF3 may be formed in the electrolytic solution.

Alternatively, after the metal film MF1 is formed, the metal film MF3 may be formed by electroplating on the second layer 65 side of the metal film MF1 in an electrolytic solution without forming the metal film MF2. A voltage to be applied for forming this metal film MF3 is higher than a voltage to be applied on the first layer 60 side of the metal film MF1.

Figure 6A:
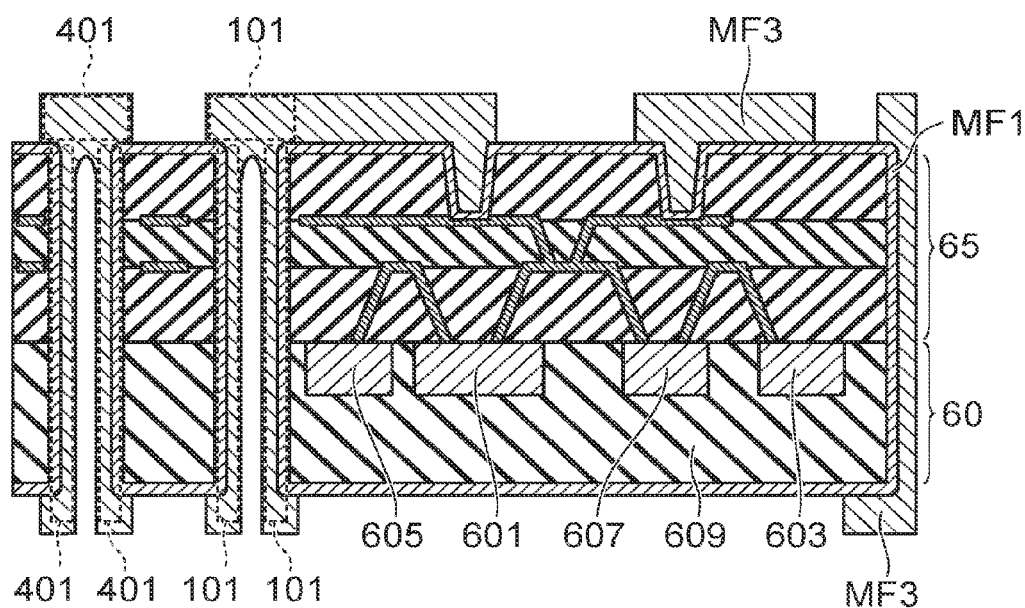

As shown in FIG. 6A, the resist mask RM is removed. The removal of the resist mask RM is performed by, for example, a wet etching method. As a chemical solution for the wet etching, for example, KOH (potassium hydroxide) can be used.

Figure 6B:
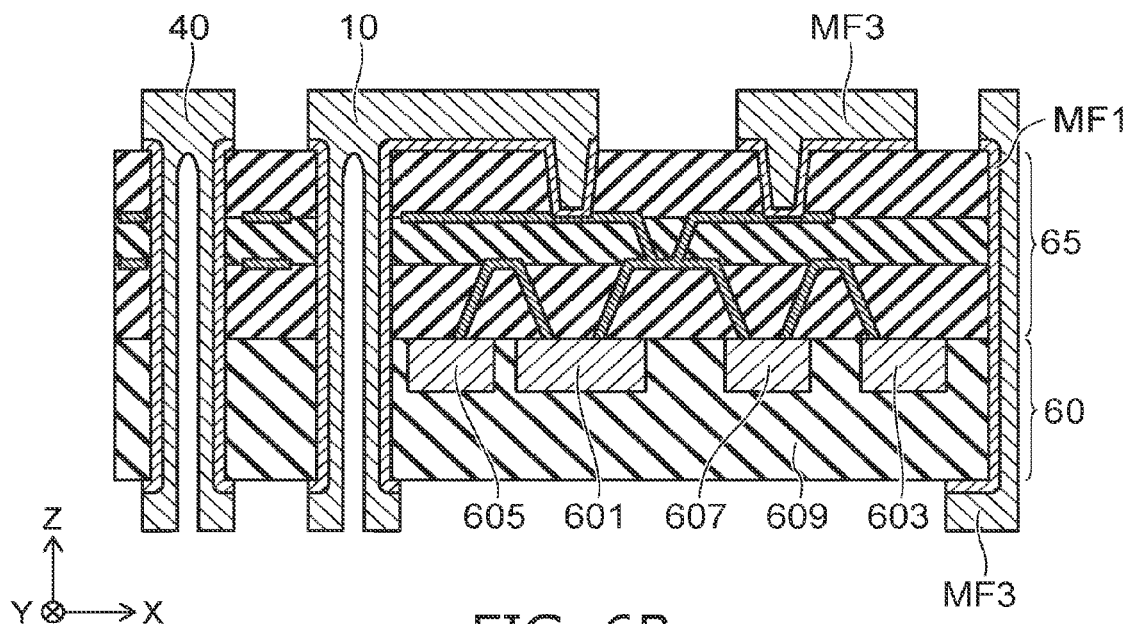

As shown in FIG. 6B, a portion of the metal film MF1 which is not covered with the metal film MF3 is removed by a wet etching method. At this time, the metal film MF3 is also partially removed in the film thickness direction. A film thickness of the metal film MF3 is sufficiently thicker than a film thickness of the metal film MF1. Due to this, when both of the metal film MF1 and the metal film MF3 are brought into contact with a chemical solution, the metal film MF3 is not completely removed and remains. As the chemical solution for the wet etching, for example, a mixed acid containing nitric acid and sulfuric acid can be used.

By separating the metal film MF1 into multiple films, a first conductive portion 10 and a fourth conductive portion 40 are formed.

Figure 7A:
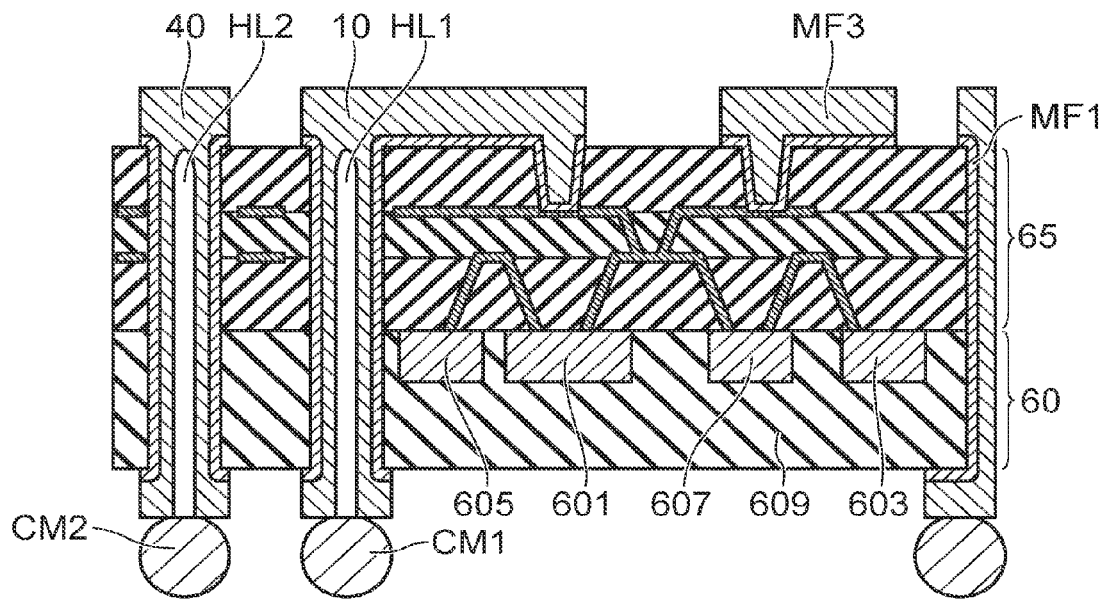

As shown in FIG. 7A, a conductive member CM1 and a conductive member CM2 are provided. One end of the first extending portion 101 in the first direction is connected to the first end portion 102, and the conductive member CM1 is provided at the other end of the first extending portion 101 in the first direction. The conductive member CM1 is, for example, provided so as to close the hole HL1. One end of the fourth extending portion 401 in the first direction is connected to the fourth end portion 402, and the conductive member CM2 is provided at the other end of the fourth extending portion 401 in the first direction. The conductive member CM2 is, for example, provided so as to close the hole HL2.

As the conductive member, for example, a solder ball containing SnAgCu, an Au stud bump, a Cu micro bump formed by electroplating, or the like can be used.

Such a conductive member is provided at one end of the first extending portion 101 using, for example, a printing device.

The conductive member is deformed by heating while applying a pressure to the conductive member. For example, the conductive member is melted by heat. A part of the conductive member CM1 is embedded in the inside of the hole HL1. In the same manner, a part of the conductive member CM2 is embedded in the inside of the hole HL2.

It is desirable that the embedding of the conductive member in each hole is performed in a reduced pressure atmosphere (in a space in which the pressure is lower than the atmospheric pressure).

By this process, a second conductive portion 20 including a second end portion 202 and a second extending portion 201, and a fifth conductive portion 50 including a fifth end portion 502 and a fifth extending portion 501 are formed. By doing this, a semiconductor module 5 is fabricated.

Figure 7B:
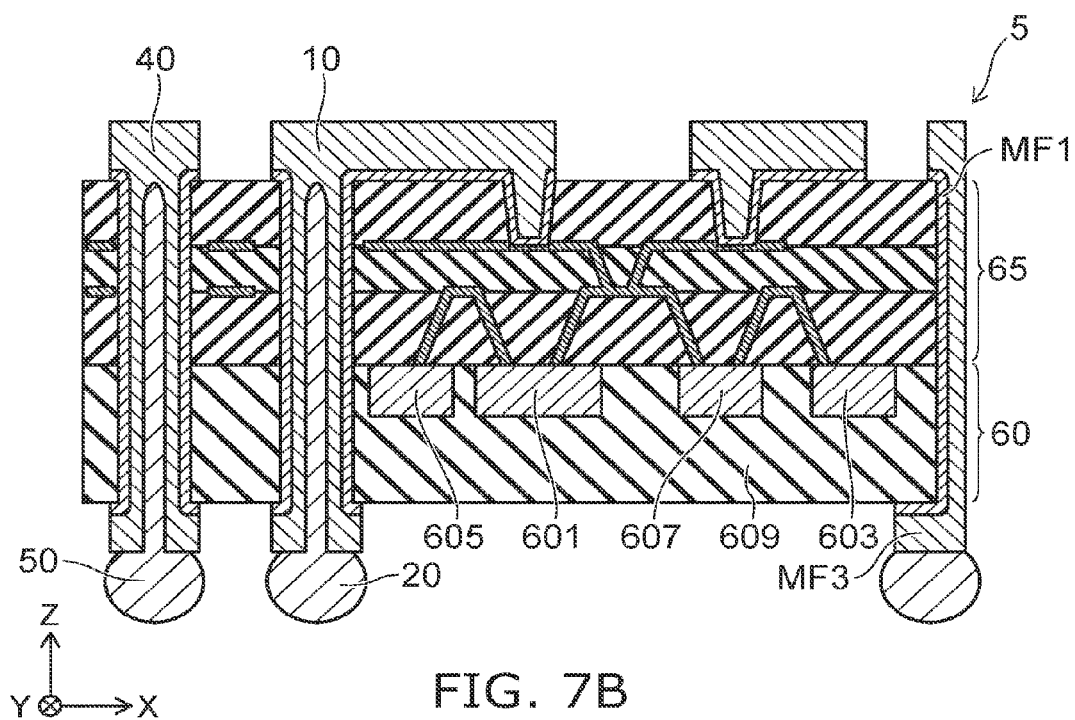

A state at this time is shown in FIG. 7B.

It is desirable that a length Le2 of at least a part of the second end portion 202 in the second direction is longer than a diameter of the hole HL1 (a length of the first extending portion 101 in the second direction). According to this, the connection between the second conductive portion 20 and a conductive portion provided in another semiconductor module is facilitated.

It is desirable that a length Le5 of at least a part of the fifth end portion 502 in the second direction is longer than a diameter of the hole HL2 (a length of the fourth extending portion 401 in the second direction). According to this, the connection between the fifth conductive portion 50 and a conductive portion provided in another semiconductor module is facilitated.

After the second conductive portion 20 and the fifth conductive portion 50 are formed, when these conductive portions are cooled, these conductive portions are shrunk. According to this, a void may sometimes be formed between the second extending portion 201 and the first end portion 102, and between the fifth extending portion 501 and the fourth end portion 402.

The process for providing conductive members and the process for melting these conductive members by heating may be performed continuously. That is, the conductive members may be melted by bringing the conductive members and a part of the metal film MF3 into contact with each other while applying a pressure, and heating these members in this state.

According to the method for manufacturing a semiconductor device according to the embodiment, in a process for manufacturing a semiconductor device including a multilayer wiring layer, a possibility of causing disconnection in the first conductive portion 10 can be reduced.

The reason for this is as follows.

A hole passing through a semiconductor device including a multilayer wiring layer and a layer containing a resin has a higher aspect ratio than a hole passing through a layer including a single wiring layer. It is not easy to fill the inside of a hole having such a high aspect ratio with a conductive material.

Due to this, for example, a method in which a film covering an inner wall of a hole is formed by an electroless plating method or the like without embedding the hole to form a conductive path between an upper surface and a lower surface of a structural body is contemplated.

However, in this case, when heat is applied to the semiconductor device, stress occurring between a portion in the form of a cylinder provided in the inside of the hole and a portion provided on the upper surface or the lower surface of the structural body in the conductive film becomes large. As a result, a crack may occur in a part of the conductive film to cause disconnection.

On the other hand, in the method for manufacturing a semiconductor device according to the embodiment, by forming the first extending portion 101 in the form of a cylinder extending in the first direction and the first end portion 102 which is connected to the first extending portion 101, overlaps with the first extending portion 101 in the first direction, and closes one end of the hole HL1 in the first direction, the first conductive portion 10 is formed.

By adopting such a manufacturing method, stress to be applied to the connecting portion between the first extending portion 101 and the first end portion 102 can be dispersed in the second direction in the first end portion 102.

Further, in the method for manufacturing a semiconductor device according to the embodiment, the first extending portion 101 and the first end portion 102 are formed by using the first conductive material. Due to this, the adhesiveness between the first extending portion 101 and the first end portion 102 can be improved.

As a result, in the process for manufacturing a semiconductor device, a possibility of causing disconnection in the first conductive portion 10 can be reduced.

In the method for manufacturing a semiconductor device according to the embodiment, by forming the first extending portion 101 and the first end portion 102 by a plating method, the first extending portion 101 and the first end portion 102 can be formed as one body.

By forming the first extending portion 101 and the first end portion 102 as one body, the first conductive portion 10 in which there is no boundary between the first extending portion 101 and the first end portion 102 can be fabricated.

As a result, in the process for manufacturing a semiconductor device, a possibility of causing disconnection in the first conductive portion 10 can be further reduced.

In the method for manufacturing a semiconductor device according to the embodiment, by forming the second conductive portion 20 using the conductive member containing the second conductive material having a melting point lower than a melting point of the first conductive material to be contained in the first conductive portion 10, a possibility of causing deformation of the first conductive portion 10 when forming the second conductive portion 20 can be reduced.

Due to this, the yield in the process for manufacturing a semiconductor device can be improved.

In the method for manufacturing a semiconductor device according to the embodiment, as an example, the second extending portion 201 is formed by providing the conductive member at one end of the first extending portion 101 in the first direction, melting this conductive member, and pouring the conductive member into at least a part of a space surrounded by the first extending portion 101.

In this case, it is desirable that the second extending portion 201 is formed in a space in which the pressure is reduced as compared with the atmospheric pressure. It is because this facilitates the filling of the inside of the hole HL1 with the second extending portion 201 when forming the second extending portion 201. In addition, a possibility of damaging the first end portion 102 due to air remaining inside the hole HL1 can be reduced.

In the example of the semiconductor device 1 illustrated in FIG. 1, a semiconductor module 7 and a printed wiring board 9 are further provided. The semiconductor module 7 includes a third conductive portion 73, a sixth conductive portion 76, a seventh conductive portion 77, and an eighth conductive portion 78.

The third conductive portion 73 is connected to the second end portion 202 of the second conductive portion 20.

The sixth conductive portion 76 is connected to the fifth end portion 502 of the fifth conductive portion 50.

The seventh conductive portion 77 includes, for example, a first electrode 771 and a first connection portion 772.

The eighth conductive portion 78 includes, for example, a second electrode 781 and a second connection portion 782.

The third conductive portion 73 may be electrically connected to the seventh conductive portion 77 or the eighth conductive portion 78 through a hole (not shown). The third conductive portion 73 may include a third extending portion having the same structure as that of the first extending portion 101 and a third end portion having the same structure as that of the first end portion 102.

The sixth conductive portion 76 may be electrically connected to the seventh conductive portion 77 or the eighth conductive portion 78 through a hole (not shown). The sixth conductive portion 76 may include a sixth extending portion having the same structure as that of the fourth extending portion 401 and a sixth end portion having the same structure as that of the fourth end portion 102.

The printed wiring board 9 includes a third electrode 93 and a fourth electrode 94.

The third electrode 93 is connected to, for example, the first connection portion 772 of the seventh conductive portion 77.

The fourth electrode 94 is connected to, for example, the second connection portion 782 of the eighth conductive portion 78.

The semiconductor module 5 is mounted on the printed wiring board 9 through the semiconductor module 7.

In the case where the semiconductor device 1 includes the semiconductor module 7 and the printed wiring board 9, after fabricating the above-described semiconductor module 5, this semiconductor module 5 is connected to the semiconductor module 7. Then, the semiconductor module 5 and the semiconductor module 7 are mounted on the printed wiring board 9, whereby the semiconductor device 1 shown in FIG. 1 is obtained.

A demand for reduction in the size and weight of an electronic apparatus has been increasing, and a technique for reducing the size of a semiconductor element and a technique for mounting a semiconductor package at a high density have been advanced.

Accompanying this, SoC (System on Chip) or SiP (System in Package) has been proposed as a next generation high-density mounting technique. The development race for SoC or SiP has become active from the viewpoint of reduction in size, increase in integration density, multi-functionalization, reduction in cost, etc.

In the SoC technique, multiple semiconductor chips are integrated on one chip at a high density. By adopting this method, fine wiring within the chip can be achieved. Further, a chip having multifunctionality can be fabricated, and a package cost can also be reduced. From these points of view, expectations have been gathered, however, a device which can be formed as a one chip module has a technical limitation. For example, it is difficult to integrate a passive component such as a resistance or a capacitor and a component for which new development has been advanced of a semiconductor device or the like at a high density, and there is a disadvantage that it takes time for the development.

The SiP technique is a method for mounting various devices on an interposer. In the SiP technique, relatively a lot of types of components can be mounted, however, there is a problem that the size or cost is increased depending on the mounting technique. For example, in the case of using wire bonding, a lot of space is needed.

In view of these problems, a mounting method called a pseudo SoC technique is proposed. In this method, a device is configured in the form covering multiple semiconductor chips having different functions with a resin as one package called a reconstruction technique. In a mold resin, glass-based fine particles (filler) are mixed, and therefore, the thermal expansion coefficient and viscosity can be controlled. As a result, it becomes possible to mount a device which is difficult to mount on the same substrate by a conventional SoC technique.

In recent years, in SiP or pseudo SoC, products to which various three-dimensional mounting techniques such as wire bonding, a through electrode, a solder ball, a substrate bonding technique, and rewiring are applied have been developed. Among the three-dimensional mounting techniques, PoP (Package on Package) and CoC (Chip on Chip) for mounting a wiring board on another wiring board in which a semiconductor chip is sealed have attracted attention, and among the methods, a through electrode has been widely used.

For example, in PoP, by a process for reconstructing a wafer, a semiconductor chip is disposed in an organic resin. Then, by subjecting a resin substrate having the semiconductor chip disposed therein to a process called a mechanical drilling process or a laser drilling process, a through hole is formed in the resin substrate. Thereafter, by a process such as plating or solder filling, a metal film is formed in the inside of the through hole, whereby a wiring board capable of electrically connecting a surface of the resin substrate to the other surface thereof is obtained. The wiring board is mounted in a stacked manner by using a solder ball, a bump electrode such as a stud bump, or the like, and is used as one chip provided with an I/O electrode.

As a reference example, a structure in which one package is formed by electrically connecting a wiring formed on one surface of a resin substrate to a wiring formed on the other surface thereof by a through electrode formed on the resin substrate, and connecting this resin substrate to another substrate mounting with a bump electrode can be exemplified. In the resin substrate used here, a silica-based material such as a filler or a glass cloth is mixed.

In the structure according to this reference example, a Cu film is formed by an electroplating technique as a through electrode formed in the resin substrate. As the bump metal to be connected to the through electrode, a solder ball containing SnAgCu as a base is used.

In this structure, since the through electrode and the bump electrode are formed from different materials, the adhesiveness is weak, and therefore, at this place where stress is liable to occur, a damage is easily caused in the conductive body. Further, since the through electrode and the bump electrode are fabricated by different processes, this causes further deterioration of the adhesiveness.

As another reference example, a configuration in which a Cu film is formed by electroplating as a through electrode in a resin substrate can be exemplified. In the reference example, this Cu film also serves as a wiring on an upper surface and a lower surface of the resin substrate. In this structure, the through electrode and a wiring layer are fabricated by the same process, however, since a pressure to be applied between the through electrode and the wiring layer is large, there is a problem that a crack easily occurs.

As still another reference example, a structure called a stack via in which through electrodes in resin substrates are stacked on one another can be exemplified. In this structure, although the materials of the through electrodes are the same, a process for bonding through wirings is different from a process for forming through wirings, and therefore, due to a residue of an organic film or the like or an effect of an oxide film, the through electrodes are liable to be peeled from each other.

As still another reference example, a configuration in which a through electrode in a resin substrate and another resin substrate are mounted on each other by bonding with a bump electrode can be exemplified. In this structure, a Cu film formed by electroplating is used as the through electrode. As the bump electrode, a solder ball is used. A metal plate of Al or the like is disposed between the through electrode and the bump electrode. In this structure, the through electrode, the bump electrode, and the metal plate are formed from different materials, respectively, and also formed by different processes, respectively. Therefore, there is a problem that after these members are mounted on each other by bonding, the members are liable to be peeled from each other at a bonding place where stress is liable to occur.

As still another reference example, a configuration in which a through electrode in a resin substrate and another resin substrate are mounted on each other by bonding with a bump electrode can be exemplified. In this structure, a side surface of the through electrode is composed of a Cu film formed by electroplating. An internal portion of the through electrode is composed of an Au stud bump. A bonding face is composed of a metal plate of Al or the like. In this structure, the respective members are formed from different materials, respectively, and also fabricated by different processes, respectively. Therefore, there is a problem that adhesiveness is weak, and thus, the members are liable to be peeled from each other. Further, since a hard metal such as a stud bump is used, a void is liable to occur in a bonding portion, and this causes a further decrease in the adhesive strength. A similar problem occurs even if a metal needle or the like is used other than a stud bump.

As described above, in a structure in which a wiring board provided with a bump electrode is mounted by bonding on another wiring board provided with a resin substrate having a semiconductor chip disposed in an organic resin, a multilayer wiring, and a through electrode, stress is liable to be concentrated on a bonding portion between the through electrode and the multilayer wiring and a bonding portion between the through electrode and the bump electrode.

Further, a technique in which a thickness of a resin substrate is increased for reducing stress is contemplated, however, it is not easy to fill a through electrode having a high aspect ratio with a metal.

The embodiment proposes a structure having high connection reliability in a bonding portion between a through electrode and a wiring connecting the through electrode and a multilayer wiring (for example, a bonding portion between the first extending portion 101 and the first end portion 102), on which stress is liable to be concentrated.

The embodiment further proposes a structure having high connection reliability in a bonding portion between a through electrode and a bump electrode (for example, a bonding portion between the second extending portion 201 and the second end portion 202), on which stress is liable to be concentrated.

An integrated semiconductor device of the embodiment is configured such that at least multiple semiconductor chips having different functions and passive chip components are disposed in an organic resin, and the semiconductor chips and the passive chip components are mutually connected through a multilayer wiring layer having an insulating layer, wherein the integrated semiconductor device includes through electrodes (for example, the first extending portion 101 and the second extending portion 201).

Further, the device has a structure in which an uppermost layer wiring (for example, a part of the first conductive portion 10) of the multilayer wiring layer, a surface of a through electrode to be in contact with the multilayer wiring (for example, the first end portion 102), and a side surface of a through electrode (for example, the first extending portion 101) are formed from a first metal.

Then, the through electrode has a structure in which a bump electrode (for example, the second end portion 202) formed on an opposite surface to the multilayer wiring and an internal portion of a hole of the through electrode are formed from a second metal.

In the embodiment, in a bonding portion between the through electrode and the multilayer wiring, on which stress is concentrated, a side surface of the through electrode, a contact portion between the through electrode and the multilayer wiring, and a wiring portion of the multilayer wiring each have a structure in which the thickness is locally large. Further, these portions are formed from the same metal fabricated by the same process. Due to this, the connection reliability is high.

In addition, in a bonding portion between the through electrode and the bump electrode, on which stress is concentrated, a contact area between an internal portion of the through electrode and the bump electrode is large, and these are formed from the same metal fabricated by the same process, and therefore, the connection reliability is high.

Further, the through electrode passes through the substrate having the multilayer wiring, and has a high aspect ratio. Due to this, it is possible to suppress stress from being concentrated locally.

Further, from the viewpoint of a fabrication process, a void or a gap can be prevented from occurring, and therefore, the connection reliability is high.

In the embodiment, as the diameter of the through electrode and the bump electrode is smaller, an effect of decreasing stress is larger.

Next, a semiconductor device 2 according to a second embodiment will be described with reference to FIG. 8.

Figure 8:
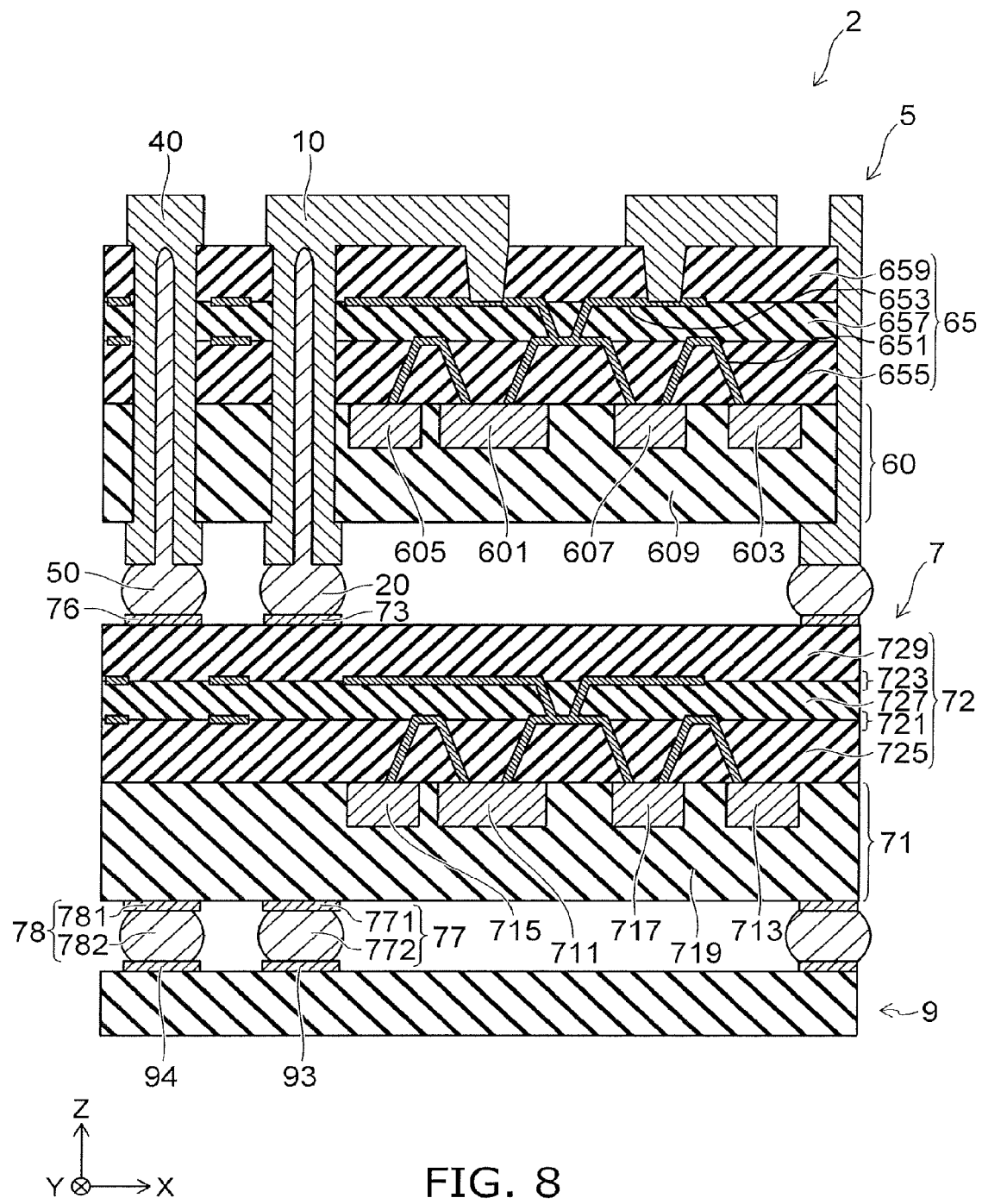
FIG. 8 is a cross-sectional view of the semiconductor device 2 according to the second embodiment.

FIG. 8 is a cross-sectional view of the semiconductor device 2 according to the second embodiment.

The semiconductor device 2 includes a semiconductor module 5, a semiconductor module 7, and a printed wiring board 9.

It is possible to use the same configuration as that of the semiconductor module 5 in the semiconductor device 1 for the semiconductor module 5 in the semiconductor device 2.

In the semiconductor device 2, the semiconductor module 7 includes a third layer 71, a fourth layer 72, a third conductive portion 73, a sixth conductive portion 76, a seventh conductive portion 77, and an eighth conductive portion 78.

The third layer 71 is, for example, a semiconductor module formed by using a pseudo SoC technique.

The third layer 71 expands along a third plane intersecting the first direction. The third layer 71 is separated from a first layer 60 and a second layer 65 in the first direction.

In the same manner as the first layer 60, the third layer 71 includes multiple semiconductor chips 711 and 713, multiple passive chip components 715 and 717, and a resin 719. In the third layer 71, the multiple semiconductor chips and the multiple passive chip components expand along a third plane.

The third plane is, for example, a plane parallel to the X-direction and the Y-direction perpendicular to the X-direction and the Z-direction in FIG. 8.

The fourth layer 72 is arranged with the third layer 71 in the first direction. The fourth layer 72 expands along a fourth plane intersecting the first direction. That is, at least a part of the fourth layer 72 overlaps with at least a part of the third layer 71 in the first direction. The fourth layer 72 is separated from the first layer 60 and the second layer 65 in the first direction.

The fourth plane is, for example, a plane parallel to the X-direction and the Y-direction perpendicular to the X-direction and the Z-direction in FIG. 8.

The fourth layer 72 includes a third wiring layer 721, a fourth wiring layer 723, a fourth insulating layer 725, a fifth insulating layer 727, and a sixth insulating layer 729.

A semiconductor chip and a passive chip component contained in the third layer 71 are connected to a wiring included in the fourth layer 72. That is, at least one of the semiconductor chips 711 and 713, and at least one of the passive chip components 715 and 717 are electrically connected to a second multilayer wiring layer including the third wiring layer 721 and the fourth wiring layer 723.

As the material of the resin 719, the same material as that of the resin 609 can be used.

As the material of the third wiring layer 721 and the fourth wiring layer 723, the same material as that of the first wiring layer 651 can be used.

As the material of the fourth insulating layer 725, the fifth insulating layer 727, and the sixth insulating layer 729, the same material as that of the first insulating layer 655 can be used. As an example, a thermal expansion coefficient of at least any of an insulating material contained in the fourth insulating layer 725, an insulating material contained in the fifth insulating layer 727, and an insulating material contained in the sixth insulating layer 729 is higher than a thermal expansion coefficient of the resin contained in the resin 609.

The third conductive portion 73 is, for example, provided in contact with the fourth layer 72. The third conductive portion 73 is electrically connected to the second conductive portion 20.

The third conductive portion 73 may be electrically connected to a wiring included in the fourth layer 72.

Similarly, the sixth conductive portion 76 is also, for example, provided in contact with the fourth layer 72. The sixth conductive portion 76 is electrically connected to the fifth conductive portion 50.

The sixth conductive portion 76 may be electrically connected to a wiring included in the fourth layer 72.

The seventh conductive portion 77 is provided in contact with the third layer 71. The seventh conductive portion 77 may be connected to the third conductive portion 73 or the sixth conductive portion 76 through a hole (not shown). The seventh conductive portion 77 may include a seventh extending portion having the same structure as that of the second extending portion 201 and a seventh end portion having the same structure as that of the second end portion 202.

The eighth conductive portion 78 is provided in contact with the third layer 71. The eighth conductive portion 78 may be connected to the third conductive portion 73 or the sixth conductive portion 76 through a hole (not shown).

The printed wiring board 9 includes a third electrode 93 and a fourth electrode 94.

The third electrode 93 is connected to the seventh conductive portion 77, and the fourth electrode 94 is connected to the eighth conductive portion 78. The third conductive portion 73 may be electrically connected to another electrode (not shown) included in the printed wiring board 9. Similarly, the sixth conductive portion 76 may be electrically connected to another electrode (not shown) included in the printed wiring board 9.

The third conductive portion 73 and the sixth conductive portion 76 can be formed by the same manufacturing method as that for the first conductive portion 10.

The seventh conductive portion 77 and the eighth conductive portion 78 can be formed by the same manufacturing method as that for the second conductive portion 20.

By adopting the same configuration as that of the semiconductor module 5 also for the semiconductor module 7, a possibility of causing disconnection in, for example, the third conductive portion 73 of the semiconductor module 7 can be reduced, and thus, the reliability of the semiconductor device 1 can be improved.

In the case where the thermal expansion coefficient of an insulating material contained in an insulating layer of the fourth layer 72 and the thermal expansion coefficient of a resin contained in the resin 609 of the first layer 60 are different, when heat is applied to the semiconductor device, etc., stress occurring in the second conductive portion 20 connected to the third conductive portion 73 becomes large. When the stress occurring in the second conductive portion 20 becomes large, a possibility of causing disconnection between the first conductive portion 10 and the second conductive portion 20 is increased.

On the other hand, according to the semiconductor device according to the embodiment, since the second conductive portion 20 includes the second extending portion 201, a contact area between the second conductive portion 20 and the first conductive portion 10 can be increased, and thus, stress occurring in the second conductive portion 20 can be reduced.

In the case where the thermal expansion coefficient of an insulating material contained in an insulating layer of the second layer 65 is higher than the thermal expansion coefficient of a resin contained in the first layer 60, and the thermal expansion coefficient of an insulating material contained in an insulating layer of the fourth layer 72 is higher than the thermal expansion coefficient of a resin contained in the first layer 60, a large stress is applied to the first conductive portion 10 and the second conductive portion 20. The semiconductor device 2 according to the embodiment is particularly effective in such a case.

According to the embodiment, a semiconductor device and a method for manufacturing the device capable of improving the reliability can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor device such as the semiconductor chip, the passive chip component, the resin, the wiring layer, the multilayer wiring, the insulating layer, the conductive portion, and the printed wiring board, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices and all methods for manufacturing the semiconductor devices practicable by an appropriate design modification by one skilled in the art based on the semiconductor devices and the methods for manufacturing the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first conductive portion including
      a first end portion which contains a first conductive material, and
      a first extending portion in the form of a cylinder, the first extending portion extending in a first direction, containing the first conductive material, and being connected to the first end portion, a length of the first extending portion in a second direction being shorter than a length of at least a part of the first end portion in the second direction, the second direction intersecting the first direction, the first extending portion including a first portion and a second portion, and the second portion arranged with the first portion in the first direction;
   a second conductive portion including a second end portion, the second end portion being separated from the first end portion in the first direction, the second end portion being electrically connected to the first extending portion, the first extending portion being provided between the first end portion and the second end portion;
   a first layer including multiple semiconductor chips, multiple passive chip components, and a resin,
      the first layer being provided around the first portion and expanding along a first plane intersecting the first direction,
      one of the multiple semiconductor chips having at least any of a function different from a function of another one of the multiple semiconductor chips, a shape different from a shape of the another semiconductor chip, and a size different from a size of the another semiconductor chip, and
      the resin being in contact with the multiple semiconductor chips and the multiple passive chip components; and
   a second layer including a first multilayer wiring, the first multilayer wiring electrically connected to at least one of the multiple semiconductor chips, at least one of the multiple passive chip components, and the first conductive portion, the second layer being provided around the second portion and expanding along a second plane intersecting the first direction.

2. The device according to claim 1, wherein the second portion is provided between the first portion and the first end portion.

3. The device according to claim 2, wherein
at least a part of the first end portion does not overlap with the second layer in the second direction, and
at least a part of the second end portion does not overlap with the first layer in the second direction.

4. The device according to claim 1, wherein the second layer includes a first insulating layer, and a thermal expansion coefficient of a first insulating material contained in the first insulating layer is higher than a thermal expansion coefficient of the resin included in the first layer.

5. The device according to claim 1, wherein
the second conductive portion further includes a second extending portion extending in the first direction,
the first portion is provided between the second extending portion and the first layer,
the second end portion and the second extending portion contain a second conductive material, and
a length of at least a part of the second end portion in the second direction is longer than a length of the second extending portion in the second direction.

6. The device according to claim 5, wherein the second portion is provided between the second extending portion and the second layer.

7. The device according to claim 5, wherein the first conductive material is different from the second conductive material.

8. The device according to claim 7, wherein a melting point of the first conductive material is higher than a melting point of the second conductive material.

9. The device according to claim 1, wherein the device further comprises:
a third layer, which includes multiple semiconductor chips, expands along a third plane intersecting the first direction, and is separated from the first layer and the second layer in the first direction;
a fourth layer, which includes a second multilayer wiring electrically connected to at least one of the multiple semiconductor chips of the third layer, expands along a fourth plane intersecting the first direction, is arranged with the third layer in the first direction, and is separated from the first layer and the second layer in the first direction; and
a third conductive portion which is in contact with the fourth layer and is electrically connected to the second conductive portion.

10. The device according to claim 9, wherein the fourth layer includes a second insulating layer, and a thermal expansion coefficient of a second insulating material contained in the second insulating layer is higher than a thermal expansion coefficient of the resin included in the first layer.

* * * * *